(12) United States Patent
Huss (10) Patent No.: US 11,637,574 B2
(45) Date of Patent: Apr. 25, 2023

(54) DATA TRANSMISSION OF VALUE PAIR IN NETWORK SYSTEMS

(71) Applicant: Telefonaktiebolaget LM Ericsson (publ), Stockholm (SE)

(72) Inventor: Fredrik Huss, Sundbyberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 171 days.

(21) Appl. No.: 17/312,920

(22) PCT Filed: Dec. 10, 2018

(86) PCT No.: PCT/SE2018/051267
§ 371 (c)(1),
(2) Date: Jun. 10, 2021

(87) PCT Pub. No.: WO2020/122772
PCT Pub. Date: Jun. 18, 2020

(65) Prior Publication Data
US 2022/0029651 A1    Jan. 27, 2022

(51) Int. Cl.
*H04B 1/04* (2006.01)
*H04B 1/10* (2006.01)
(Continued)

(52) U.S. Cl.
CPC ............ *H04B 1/0475* (2013.01); *H03M 7/24* (2013.01); *H04B 1/10* (2013.01); *H04L 27/3444* (2013.01)

(58) Field of Classification Search
CPC ......... H04B 1/0475; H04B 1/10; H03M 7/24; H04L 27/3444
(Continued)

(56) References Cited

U.S. PATENT DOCUMENTS

| 7,088,276 | B1 | 8/2006 | Wegener |
| 2012/0250740 | A1 | 10/2012 | Ling |
| 2019/0339937 | A1 | 11/2019 | Lo et al. |

FOREIGN PATENT DOCUMENTS

| CN | 102316517 A | 1/2012 | |
| EP | 3065324 A1 * | 9/2016 | ........ H03M 7/3059 |

(Continued)

OTHER PUBLICATIONS

Lintz, Christensen: Block Floating Point for Radar Data, IEEE Transactions on Aerospace and Electronic Systems, IEEE service center, Piscataway, NJ, US, vol. 35, No. 1, Jan. 1, 1999 (Jan. 1, 1999), pp. 308-318 XP011002598. ISSN: 0018-9251, DOI: 10.1109/7.745700. (Year: 1999).*

(Continued)

*Primary Examiner* — Kevin M Burd
(74) *Attorney, Agent, or Firm* — Nicholson De Vos Webster & Elliott LLP (57) ABSTRACT

A method for data transmission of a value pair in a network system. The method is performed in a network node and comprises transforming a value pair, wherein the value pair is represented as a complex number, by changing a magnitude of the value pair with a factor of 2 raised to the power of N/2, where N is an integer, and when N is odd the transform comprises a rotation in the complex plane of an odd integer multiple of 45 degrees, and transmitting the transformed value pair to another network node, wherein the transmission comprises an indication of the value of N. Network nodes, computer programs and a computer program product for data transmission of a value pair in a network system are also presented.

26 Claims, 3 Drawing Sheets

(51) Int. Cl.
*H03M 7/24* (2006.01)
*H04L 27/34* (2006.01)

(58) Field of Classification Search
USPC .......................................................... 375/285
See application file for complete search history.

(56) References Cited

FOREIGN PATENT DOCUMENTS

| EP | 3065324 A1 | 9/2016 |
|---|---|---|
| RU | 2305898 C2 | 9/2007 |
| WO | 2009151893 A2 | 12/2009 |
| WO | 2020/122772 A1 | 6/2020 |

OTHER PUBLICATIONS

Non-Final Office Action, U.S. Appl. No. 17/312,932, dated Aug. 16, 2022, 8 pages.
"XRAN Fronthaul Working Group, Control, User and Synchronization Plane Specification," 2018, 156 pages, XRAN-FH.CUS.0-v02.00, Technical Specification, xRAN.org.
Cheolwoo You, "Near-lossless compression/decompression algorithms for digital data transmitted over fronthaul in C-RAN," Aug. 23, 2016, pp. 533-548, Springer Science+Business Media, New York.
International Preliminary Report on Patentability for Application No. PCT/SE2018/051375, dated Jun. 24, 2021, 9 pages.
International Search Report and Written Opinion for Application No. PCT/SE2018/051375, dated Feb. 21, 2019, 12 pages.
Requirement for Restriction/Election, U.S. Appl. No. 17/312,932, dated Jul. 12, 2022, 7 pages.
International Preliminary Reporton Patentability, PCT App. No. PCT/SE2018/051267, dated Jun. 24, 2021, 9 pages.
Office Action and Search Report, RU App. No. 2021119923, dated Feb. 15, 2022, 16 pages (4 pages of English Translation and 12 pages of Original Document).
International Search Report and Written Opinion for Application No. PCT/SE2018/051267, dated Feb. 19, 2019, 12 pages.
E. Lintz Christensen, "Block Floating Point for Radar Data," Jan. 1999, pp. 308-318, IEEE Transactions on Aerospace and Electronic Systems, vol. 35, No. 1, IEEE.
Ericsson AB et al., "Common Public Radio Interface (CPRI); Interface Specification," Oct. 9, 2015, 128 pages, CPRI Specification V7.0.
Notice of Allowance, U.S. Appl. No. 17/312,932, dated Jan. 3, 2023, 9 pages.
Notice of Allowance, U.S. Appl. No. 17/312,932, dated Mar. 15, 2023, 6 pages.

* cited by examiner

DATA TRANSMISSION OF VALUE PAIR IN NETWORK SYSTEMS

CROSS-REFERENCE TO RELATED APPLICATIONS

This application is a National stage of International Application No. PCT/SE2018/051267, filed Dec. 10, 2018, which is hereby incorporated by reference.

TECHNICAL FIELD

The present disclosure relates to methods, network nodes, computer programs, and a computer program product for data transmission of a value pair in a network system.

BACKGROUND

Common Public Radio Interface (CPRI) links are typically used for transferring baseband signals between radio units and baseband units in mobile networks. This enables that radio units can be placed remote from baseband units and close to antenna elements, or that baseband units can be placed at a central location connecting to several sites.

CPRI Specification V7.0 is a public standard that is used by multiple vendors. This allows for mixing of equipment from different vendors in a single network. The public standard gives a framework that can be used, but several details are left for vendors to specify. The framework e.g. comprises a digitized and serial internal base station interface between baseband units and radio units. Necessary items for transport, connectivity and control are also included, such as User Plane data, Control Plane transport mechanisms, and means for synchronization. The Specification complies with the 3rd Generation Partnership Project (3GPP). Data signalling between the baseband unit and the radio unit uses In-phase and Quadrature (IQ) modelling.

For IQ sample formats in a baseband signal on a CPRI link, 30-bit, 24-bit and 20-bit IQ samples are defined. Smaller bit widths provide a higher capacity on the CPRI link but at the cost of worse quantization, i.e. a higher noise level.

SUMMARY

One objective is to enable increased accuracy of data transfer in network systems.

According to a first aspect there is presented a method for data transmission of a value pair in a network system. The method is performed in a network node and comprises transforming a value pair, wherein the value pair is represented as a complex number, by changing a magnitude of the value pair with a factor of 2 raised to the power of $N/2$, where N is an integer, and when N is odd the transform comprises a rotation in the complex plane of an odd integer multiple of 45 degrees, and transmitting the transformed value pair to another network node, wherein the transmission comprises an indication of the value of N.

By the presented method, increased accuracy is enabled, wherein smaller bit widths can be used with the same maintained transfer capacity, which reduces capacity requirements on the network system so that a wider bandwidth can be used.

According to an embodiment of the first aspect, N is chosen as the largest value for which each of the values in the value pair can still be represented in a predetermined data size.

According to another embodiment of the first aspect, freely combinable with other embodiments thereof, the value pair is an IQ value.

According to another embodiment of the first aspect, freely combinable with other embodiments thereof, the method further comprises encoding the transformed value pair when the transformed value pair is encodeable with less quantization noise compared to a received value pair, and otherwise encoding and transmitting the received value pair. The quantization noise may be determined based on the change of magnitude.

According to another embodiment of the first aspect, freely combinable with other embodiments thereof, more than one value pair is transformed with the same change of magnitude.

According to another embodiment of the first aspect, freely combinable with other embodiments thereof, the network system is a communication network system, and the network node is a baseband unit (BBU). The method may further comprise receiving the value pair from a core network node, and transmitting the transformed value pair to a radio unit.

According to a second aspect there is presented a method for data transmission of a value pair in a network system. The method is performed in a network node and comprises receiving a value pair from another network node, wherein the transmission comprises an indication of a value of N, and transforming the received value pair, wherein the transformed value pair is represented as a complex number, by changing a magnitude of the received value pair with a factor of 2 raised to the power of $-N/2$, where N is an integer, and when N is odd the transform comprises a rotation in the complex plane of an odd integer multiple of 45 degrees.

According to an embodiment of the second aspect, the transformed value pair is an IQ value.

According to another embodiment of the second aspect, freely combinable with other embodiments thereof, more than one received value pair is transformed with the same change of magnitude.

According to another embodiment of the second aspect, freely combinable with other embodiments thereof, the method further comprises decoding the received value pair when indicated to be transformed, and otherwise decoding the received value pair.

According to another embodiment of the second aspect, freely combinable with other embodiments thereof, the network system is a communication network system, and the network node is a radio unit. The method may further comprise receiving the value pair from a baseband unit, and transmitting the transformed value pair to a wireless communication unit.

According to a third aspect there is presented a method for enabling data transmission of a value pair in a network system. The method is performed in a network system and comprises transferring a transformed value pair, wherein the transformed value pair is represented as a complex number, with a changed magnitude of the value pair with a factor of 2 raised to the power of $N/2$, where N is an integer, and when N is odd the transform comprises a rotation in the complex plane of an odd integer multiple of 45 degrees, and wherein the transmission comprises an indication of the value of N.

According to a fourth aspect there is presented a network node for data transmission of a value pair in a network system. The network node comprises a processing circuitry and a computer program product storing instructions that, when executed by the processing circuitry, causes the network node to transform a value pair, wherein the value pair is represented as a complex number, by changing a magnitude of the value pair with a factor of 2 raised to the power of N/2, where N is an integer, and when N is odd the transform comprises a rotation in the complex plane of an odd integer multiple of 45 degrees, and to transmit the transformed value pair to another network node, wherein the transmission comprises an indication of the value of N.

According to an embodiment of the fourth aspect, N is chosen as the largest value for which each of the values in the value pair can still be represented in a predetermined data size.

According to another embodiment of the fourth aspect, freely combinable with other embodiments thereof, the value pair is an IQ value.

According to another embodiment of the fourth aspect, freely combinable with other embodiments thereof, the network node further is caused to encode the transformed value pair when the transformed value pair is encodeable with less quantization noise compared to a received value pair, and otherwise encode and transmit the received value pair. The quantization noise may be determined based on the change of magnitude.

According to another embodiment of the fourth aspect, freely combinable with other embodiments thereof, more than one value pair is transformed with the same change of magnitude.

According to another embodiment of the fourth aspect, freely combinable with other embodiments thereof, the network system is a communication network system, and the network node is a baseband unit. The network node may further be caused to receive the value pair from a core network node, and to transmit the transformed value pair to a radio unit.

According to a fifth aspect there is presented a network node for data transmission of a value pair in a network system. The network node comprises a processing circuitry and a computer program product storing instructions that, when executed by the processing circuitry, causes the network node to receive a value pair from another network node, wherein the transmission comprises an indication of a value of N, and to transform the received value pair, wherein the transformed value pair is represented as a complex number, by changing a magnitude of the received value pair with a factor of 2 raised to the power of −N/2, where N is an integer, and when N is odd the transform comprises a rotation in the complex plane of an odd integer multiple of 45 degrees.

According to an embodiment of the fifth aspect, the transformed value pair is an IQ value.

According to another embodiment of the fifth aspect, freely combinable with other embodiments thereof, more than one received value pair is transformed with the same change of magnitude.

According to another embodiment of the fifth aspect, freely combinable with other embodiments thereof, the network node further is caused to decode the received value pair when indicated to be transformed, and otherwise decode the received value pair.

According to another embodiment of the fifth aspect, freely combinable with other embodiments thereof, the network system is a communication network system, and the network node is a radio unit. The network node may further be caused to receive the value pair from a baseband unit, and to transmit the transformed value pair to a wireless communication unit.

According to a sixth aspect there is presented an electromagnetic signal carrying computer-readable instructions for enabling data transmission of a value pair in a network system. The electromagnetic signal transfers a transformed value pair, wherein the transformed value pair is represented as a complex number, with a changed magnitude of the value pair with a factor of 2 raised to the power of N/2, where N is an integer, and when N is odd the transform comprises a rotation in the complex plane of an odd integer multiple of 45 degrees, and wherein the transmission comprises an indication of the value of N.

According to a seventh aspect there is presented a computer program data transmission of a value pair in a network system. The computer program comprises computer program code which, when run in a network node, causes the network node to transform a value pair, wherein the value pair is represented as a complex number, by changing a magnitude of the value pair with a factor of 2 raised to the power of N/2, where N is an integer, and when N is odd the transform comprises a rotation in the complex plane of an odd integer multiple of 45 degrees, and to transmit the transformed value pair to another network node (1), wherein the transmission comprises an indication of the value of N.

According to an eighth aspect there is presented a computer program data transmission of a value pair in a network system. The computer program comprises computer program code which, when run in an network node, causes the network node to receive a value pair from another network node, wherein the transmission comprises an indication of a value of N, and to transform the received value pair, wherein the transformed value pair is represented as a complex number, by changing a magnitude of the received value pair with a factor of 2 raised to the power of −N/2, where N is an integer, and when N is odd the transform comprises a rotation in the complex plane of an odd integer multiple of 45 degrees.

A computer program product comprising a computer program and a computer readable storage means on which the computer program is stored is also presented.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

Aspects and embodiments are now described, by way of example, with reference to the accompanying drawings, in which.

DETAILED DESCRIPTION

The aspects of the present disclosure will now be described more fully hereinafter with reference to the accompanying drawings, in which certain embodiments of the invention are shown.

These aspects may, however, be embodied in many different forms and should not be construed as limiting; rather, these embodiments are provided by way of example so that this disclosure will be thorough and complete, and to fully convey the scope of all aspects of invention to those skilled in the art. Like numbers refer to like elements throughout the description.

Figure 1:
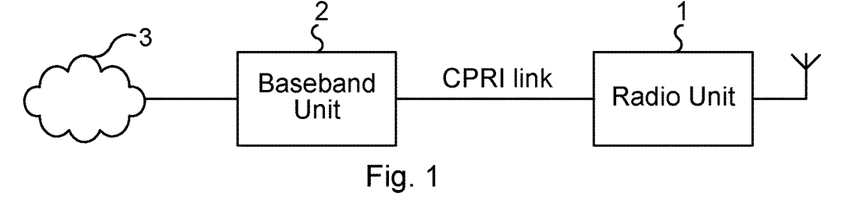
FIG. 1 schematically illustrates a CPRI link between a radio unit and a baseband unit.

FIG. 1 shows a Common Public Radio Interface (CPRI) link that connects a radio unit 1 to a baseband unit 2 in a radio communication network system. The baseband unit 2 is connected also connected to a core network 3, and the radio unit 1 is also connected to an antenna device. The present disclosure will focus on this implementation, although the presented embodiments can be applied to other network systems as exemplified below, e.g. in a modem, such as digital subscriber line (DSL) modem, in order to save memory or bandwidth, or for a memory for storing of digital signals such as sound or images.

In DSL the signal over a copper line to the subscriber is digitized and processed in the modem which handles transmission and reception at one endpoint. To save memory and bandwidth in the modem, the digitized samples can be stored in a compressed format.

Digitized signals, such as sound, images or measurements, can in general be stored in a compressed format for later processing. In a generic quantization scheme without utilizing the structure of the signal a floating-point representation can be used. This will give a higher resolution for signals with lower amplitude, to represent weak signals accurate. The storage requirement may be lowered, wherein pairs of sample values could be transformed to get a magnitude scaling of 2 raised to the power of N/2 where N is an integer.

A downlink signal can in radio communication network systems be generated in the baseband unit 2 and sent over the CPRI link to the radio unit 1 for transmission. In-phase and Quadrature (IQ) sample encoding is done in the baseband unit 2 to reduce the transmission capacity requirement over the CPRI link, and IQ sample decoding is done in the radio unit 1 to recover the downlink signal. Similarly, a received uplink signal can be sent from the radio unit 1 over the CPRI link to the baseband unit 2 for processing. IQ sample encoding and decoding is thus done in the radio unit 1 and baseband unit 2, respectively.

The wider bandwidth and the more antennas that are used in radio communication, the more capacity the baseband signal communicated between the baseband unit 2 and the radio unit 1 requires on the CPRI link, even when using the smallest defined 20-bit IQ sample format. It is desirable to have small IQ sample formats that have sufficiently low quantization noise and are simple to implement in hardware.

A value pair represented as a complex number in an IQ sample format and a transformation that achieves lower quantization noise than existing formats, given the same bit width, is presented. The transformation is simple to implement in hardware, in particular without the use of multiplications, i.e. being multiplication-free and thus limited to addition, subtraction and bit level shifting.

In an example presented herein a 20-bit IQ sample format is defined for downlink. This 20-bit IQ sample format consists of a signed 9-bit mantissa value for the real part, a signed 9-bit mantissa value for the imaginary part, and an unsigned 2-bit exponent (exp) with an integer base of 2. An IQ sample x in the linear domain is then determined as:

$$x = (I + i \cdot Q) \cdot 2^{exp+3}$$

With the largest exponent 6, when exp is 3, this transformation can represent 15-bit values for the real and imaginary parts. Due to the limited exponent range, small numbers can however not be represented accurately. The +3 in the exponent is used to get the same nominal values as for a corresponding 30-bit case.

To reduce the bit width for the baseband signal, one possibility is to share the same exponent for multiple IQ samples. This is commonly described as block floating point arithmetic. Block floating point algorithm operations are done through a block using a common exponent, and can be advantageous to limit the space use in hardware to perform the same functions as floating point algorithms. The exponent is determined based on the sample with the largest amplitude. The number of redundant sign bits is counted, and then all samples in the block are normalized to the same exponent so that the largest sample does not have any redundant sign bits.

Figure 2:
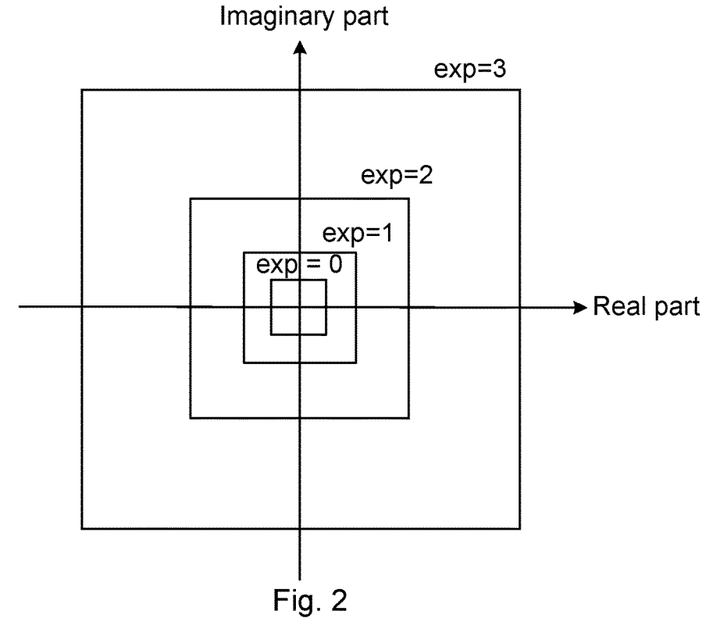
FIG. 2 schematically illustrates a IQ sample format with two exponent bits.

A block floating point over two samples may be used in the uplink 20-bit format. Other formats in uplink with higher bit width and in downlink may use an exponent that is shared over I and Q in a single sample. One drawback is that increasing the exponent by one for all samples in a block will scale the magnitude of all real and imaginary parts by a factor 2. This scaling will increase quantization noise by 6 dB, even though only a single real or imaginary part may require the higher exponent value, i.e. the largest sample is to large for a lower integer exponent value but other samples are unnecessary small for a larger integer exponent value. FIG. 2 illustrates the number range that can be represented with 2 exponent bits in the encoded sample given different values, 0-3, of the exponent. For example, if the imaginary part requires an increase of the exponent by 1, this corresponds to a magnitude scaling by a factor 2 to be covered by the range that can be represented. This will also affect the range for the real part by the same amount. A needed increase of e.g. the imaginary part with an exponent of 1 will thus also increase the magnitude of the real part with 2 and the scaling by a factor of 2. Correspondingly for an increased exponent of 2 or 3, the scaling will be increased corresponding to a magnitude scaling by a factor of 4 or 8.

It can be realized that it would be beneficial to have a fractional exponent to get a finer granularity of the scale factors, especially when many samples share the same exponent as for systems using block floating point operations. One drawback with using fractional exponents is however that it typically requires multiplications when encoding and decoding samples. It might also introduce additional rounding errors. Thus, it could be problematic to use fractional exponents in practice. A fractional exponent is a non-integer exponent.

A transformation of a sample may thus be introduced to generate a scaling factor by a magnitude of $\sqrt{2}$. This makes it possible to have one fractional exponent bit, without the need for multiplications. A possible transform of a sample is a rotation by +45 degrees for samples $x_k$ in a group as:

$$y_k = (1+i) \cdot x_k = (\text{Re}\{x_k\} - \text{Im}\{x_k\}) + i \cdot (\text{Re}\{x_k\} + \text{Im}\{x_k\})$$

Figure 3:
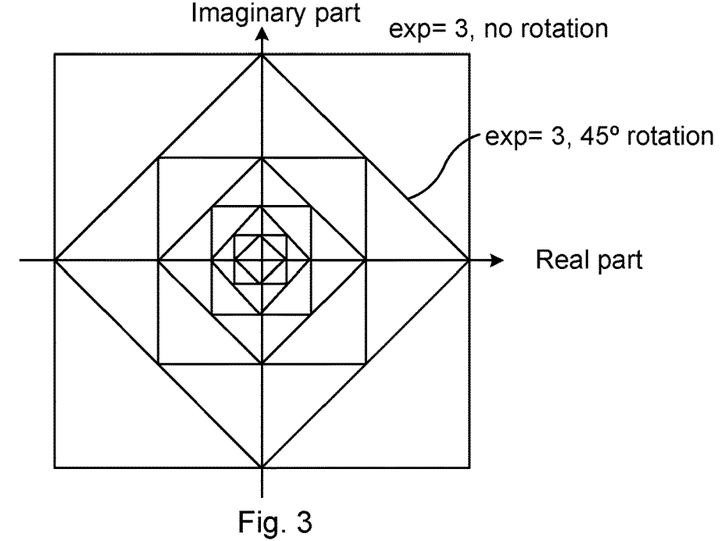
FIG. 3 schematically illustrates a IQ sample format with two exponent bits and one fractional exponent bit.

FIG. 3 illustrates the number range that can be represented with 2 exponent bits in the encoded sample and when a rotation of 45 degrees can be applied. For example, comparing the case with exponent 3 with and without application of 45 degrees rotation the difference in magnitude scaling is $1/\sqrt{2}$. The scale factor is thus less affected by a rotation of 45 degrees, compared to the scaling illustrated in FIG. 2. With an exponent of 3 and with a rotation of 45 degrees, a scaling of the magnitude of $1/\sqrt{2}$ is given compared to the corresponding untransformed sample with an exponent of 3. Other similar transforms may be used as well, e.g. rotation by −45 or +/−135 degrees and possibly including reflections using a mirror symmetric transform. With a factor of 2 raised to the power of N/2, where N is an integer, and with stepwise changes of N multiple such rotations are achieved. N may be chosen as the larges value for which each of the values of the sample can still be represented in a predetermined data size, here 20 bits.

Encoding of the sample format including a fractional exponent, e.g. ½, may be as follows. If new samples $y_k$ can be encoded without increasing the exponent compared to the encoding of $x_k$, that encoding is used instead of the encoding of $x_k$. The additional fractional exponent bit is used to indicate whether the transform was used or not. The samples $x_k$ and transformed samples $y_k$ are encoded with existing methods, not using fractional exponents.

In the decoder, the fractional exponent bit is first checked to see whether the transform was used or not.

If the transform was used, the original samples $x_k$ are recovered from the decoded samples $y_k$ using decoding methods as:

$$x_k = \left(\frac{1-i}{2}\right) \cdot y_k = \frac{(\mathrm{Re}\{y_k\} + \mathrm{Im}\{y_k\}) + i \cdot (\mathrm{Im}\{y_k\} - \mathrm{Re}\{y_k\})}{2}$$

If on the other hand the transform was not used, the decoded samples $x_k$ using existing decoding methods are used as is.

The transform in the encoder and the reverse transform in the decoder only involves additions, subtractions, and scaling of the result by ½, which can be done as bit level shifts. Thus, no additional rounding errors are introduced in the encoder and decoder, and no multiplications are needed to be performed.

As another example, a 15-bit IQ sample format where 4 consecutive samples are jointly block encoded, is presented. 7-bit signed mantissa values are used for the real and imaginary parts, respectively, and with an unsigned 3-bit exponent plus one fractional exponent bit (+1) indicating whether the transform is used or not. A total of 60 bits will then be used, with 56 bits for the signed mantissa values, 3 bits for the unsigned 3-bit exponent, and one bit for the indication bit.

The linear sample values are defined as:

$x_k = ((I_k+Q_k)+i\cdot(Q_k-I_k))\cdot 2^{exp}$ when the transform is used, and otherwise:

$x_k = (I_k+i\cdot Q_k)\cdot 2^{exp+1}$

Here $I_k$ and $Q_k$ are the encoded 7-bit mantissa values and exp is the 3-bit exponent.

Encoding may hence be performed by bit-shifting the values to correspond to a multiplication by two raised to the power of the integer part of N/2 and when N is odd (i.e. the integer part of N/2 is non-zero) a rotational transform is performed that multiplies the magnitude by $\sqrt{2}$ and rotates by an odd integer multiple of 45 degrees. Decoding may then be made in the reverse, i.e. bit-shifting to correspond to a multiplication by two raised to the power of −(the integer part of N/2). When N is odd a similar transform as in encoding is applied, multiplying by $\sqrt{2}$ and rotating by an odd integer multiple of 45 degrees, wherein the rotation preferably is the same as in the encoding transform but in the opposite direction so as not to swap or change the signs of the elements of the value pair, and finally bit-shifting to correspond to a division by two, to reverse the effect of the two multiplications by $\sqrt{2}$.

If the encoding transform is a multiplication by (1+i), i.e. a rotation by +45 degrees, the decoding transform may for example use a multiplication by (1−i), i.e. a rotation by −45 degrees.

The indication of N may be transferred as a binary representation of −N, to correspond to a conventional mantissa-exponent format.

Figure 5:
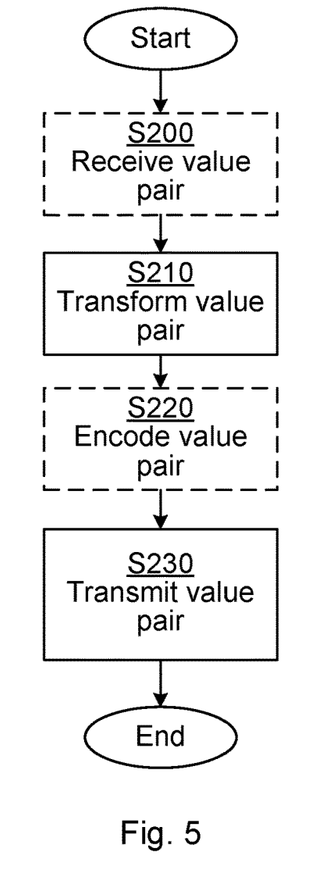

An embodiment of a method for data transmission of a value pair in a network system is presented with reference to FIG. 5. The method is performed in a network node 1 and comprises receiving S100 a value pair from another network node 2, wherein the transmission comprises an indication of a value of N, and transforming S120 the received value pair, wherein the transformed value pair is represented as a complex number, by changing a magnitude of the received value pair with a factor of 2 raised to the power of −N/2, where N is an integer, and when N is odd the transform comprises a rotation in the complex plane of an odd integer multiple of 45 degrees.

The transformed value pair may be an IQ value.

More than one received value pair may be transformed with the same change of magnitude.

The method may further comprise decoding S110 the transformed received value pair when indicated to be transformed, and otherwise decoding Silo the received value pair.

The indication of N may be represented as a binary number, where the least significant bit indicates if a rotational transform was performed or not.

The network system may be a communication network system, and the network node 1 may be a radio unit.

The method may further comprise receiving S100 the value pair from a baseband unit 2, and transmitting S130 the transformed value pair to a wireless communication unit 1.

Figure 7:
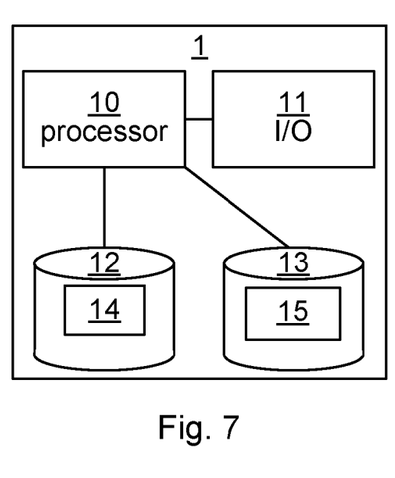
FIGS. 7-8 are schematic diagrams illustrating some components of devices presented herein.

An embodiment of a network node for data transmission of a value pair in a network system is presented with reference to FIG. 7. The network node 1 comprises a processing circuitry 10 and a computer program product 12, 13 storing instructions 14, 15 that, when executed by the processing circuitry, causes the network node to receive a value pair from another network node 2, wherein the transmission comprises an indication of a value of N, and to transform the received value pair, wherein the transformed value pair is represented as a complex number, by changing a magnitude of the received value pair with a factor of 2 raised to the power of −N/2, where N is an integer, and when N is odd the transform comprises a rotation in the complex plane of an odd integer multiple of 45 degrees.

The transformed value pair may be an IQ value.

More than one received value pair may be transformed with the same change of magnitude.

The network node may further be caused to decode the transformed received value pair when indicated to be transformed, and otherwise decode the received value pair.

The network system may be a communication network system, and the network node 1 may be a radio unit. The network node may further be caused to receive the value pair from a baseband unit 2, and to transmit the transformed value pair to a wireless communication unit 1.

Figure 4:
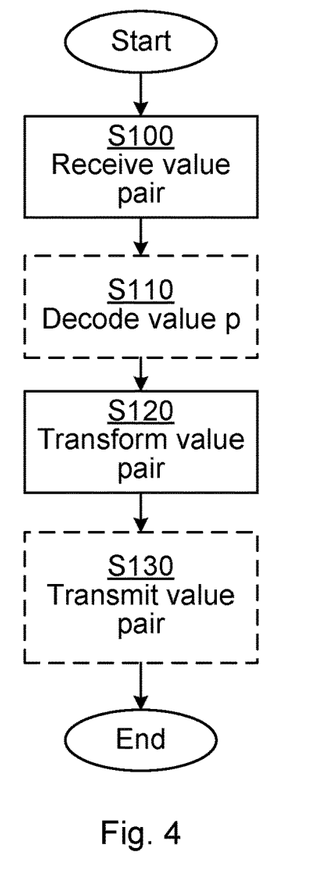
FIGS. 4-6 are flow charts illustrating methods for embodiments presented herein.

FIG. 7 is a schematic diagram showing some components of the network node 1. The processing circuitry 10 may be provided using any combination of one or more of a suitable central processing unit, CPU, multiprocessing circuitry, microcontroller, digital signal processing circuitry, DSP, application specific integrated circuit etc., capable of executing software instructions of a computer program 14 stored in a memory. The memory can thus be considered to be or form part of the computer program product 12. The processing circuitry 10 may be configured to execute methods described herein with reference to FIG. 4.

The memory may be any combination of read and write memory, RAM, and read only memory, ROM. The memory may also comprise persistent storage, which, for example, can be any single one or combination of magnetic memory, optical memory, solid state memory or even remotely mounted memory.

A second computer program product 13 in the form of a data memory may also be provided, e.g. for reading and/or storing data during execution of software instructions in the processing circuitry 10. The data memory can be any combination of read and write memory, RAM, and read only memory, ROM, and may also comprise persistent storage, which, for example, can be any single one or combination of magnetic memory, optical memory, solid state memory or even remotely mounted memory. The data memory may e.g. hold other software instructions 15, to improve functionality for the network node 1.

The network node 1 may further comprise an input/output (I/O) interface 11 including e.g. a user interface. The network node 1 may further comprise a receiver configured to receive signalling from other nodes, and a transmitter configured to transmit signalling to other nodes (not illustrated). Other components of the network node 1 are omitted in order not to obscure the concepts presented herein.

Figure 9:
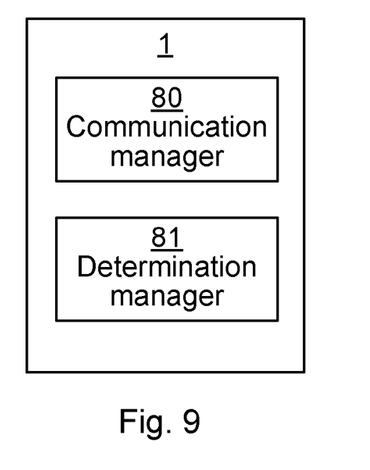
FIG. 9-10 are schematic diagrams illustrating functional module of devices presented herein.

A network node 1 for data transmission of a value pair in a network system is presented with reference to FIG. 9. The network node 1 comprises a communication manager 80 for receiving S100 a value pair from another network node 2, wherein the transmission comprises an indication of a value of N, and a determination manger 81 for transforming S120 the received value pair, wherein the transformed value pair is represented as a complex number, by changing a magnitude of the received value pair with a factor of 2 raised to the power of −N/2, where N is an integer, and when N is odd the transform comprises a rotation in the complex plane of an odd integer multiple of 45 degrees.

FIG. 9 is a schematic diagram showing functional blocks of the network node 1. The modules may be implemented as only software instructions such as a computer program executing in the cache server or only hardware, such as application specific integrated circuits, field programmable gate arrays, discrete logical components, transceivers, etc. or as a combination thereof. In an alternative embodiment, some of the functional blocks may be implemented by software and other by hardware. The modules correspond to the steps in the method illustrated in FIG. 4, comprising a communication manager unit 80 and a determination manger unit 81. In the embodiments where one or more of the modules are implemented by a computer program, it shall be understood that these modules do not necessarily correspond to process modules, but can be written as instructions according to a programming language in which they would be implemented, since some programming languages do not typically contain process modules.

The communication manager 80 is for data transmission of a value pair in a network system. This module corresponds to the steps S100 and S130 of FIG. 4. This module can e.g. be implemented by the processing circuitry 10 of FIG. 7, when running the computer program.

The determination manger 81 is for data transmission of a value pair in a network system. This module corresponds to the steps S110, and S120 of FIG. 4. This module can e.g. be implemented by the processing circuitry 10 of FIG. 7, when running the computer program.

A computer program 14, 15 for data transmission of a value pair in a network system is presented with reference to FIG. 7. The computer program comprises computer program code which, when run in a network node 1, causes the network node to receive S100 a value pair from another network node 2, wherein the transmission comprises an indication of a value of N, and to transform S120 the received value pair, wherein the transformed value pair is represented as a complex number, by changing a magnitude of the received value pair with a factor of 2 raised to the power of −N/2, where N is an integer, and when N is odd the transform comprises a rotation in the complex plane of an odd integer multiple of 45 degrees.

A computer program product 12, 13 comprising a computer program 14, 15 and a computer readable storage means on which the computer program 14, 15 is stored, is also presented.

An embodiment of a method for data transmission of a value pair in a network system is presented with reference to FIG. 5. The method is performed in a network node 2 and comprises transforming S210 a value pair, wherein the value pair is represented as a complex number, by changing a magnitude of the value pair with a factor of 2 raised to the power of N/2, where N is an integer, and when N is odd the transform comprises a rotation in the complex plane of an odd integer multiple of 45 degrees, and transmitting S230 the transformed value pair to another network node 1, wherein the transmission comprises an indication of the value of N.

The integer N may be chosen as the largest value for which each of the values in the value pair can still be represented in a predetermined data size.

The value pair may be an IQ value.

The method may further comprise encoding S220 the transformed value pair when the transformed value pair is encodeable with less quantization noise compared to a received value pair, and otherwise encoding S220 and transmitting S230 the received value pair. The quantization noise may be determined based on the change of magnitude.

The indication of N may be represented as a binary number, where the least significant bit indicates if a rotational transform was performed or not.

More than one value pair may be transformed with the same change of magnitude.

The network system may be a communication network system, and the network node 2 may be a BBU.

The method may further comprise receiving S200 the value pair from a core network node 3, and transmitting S230 the transformed value pair to a radio unit 1.

Figure 8:
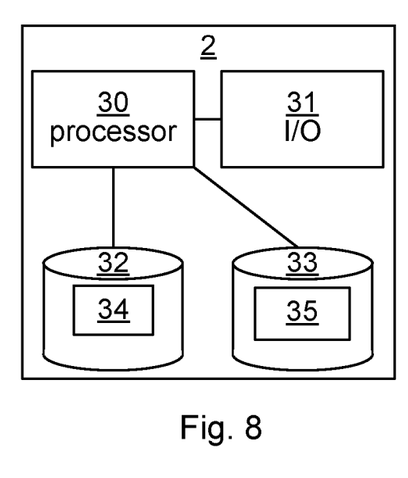

An embodiment of a network node 2 for data transmission of a value pair in a network system is presented with reference to FIG. 8. The network node 2 comprises a processing circuitry 30 and a computer program product 32, 33 storing instructions 34, 35 that, when executed by the processing circuitry, causes the network node to transform a value pair, wherein the value pair is represented as a complex number, by changing a magnitude of the value pair with a factor of 2 raised to the power of N/2, where N is an integer, and when N is odd the transform comprises a rotation in the complex plane of an odd integer multiple of 45 degrees, and to transmit the transformed value pair to another network node 1, wherein the transmission comprises an indication of the value of N.

N may be chosen as the largest value for which each of the values in the value pair can still be represented in a predetermined data size.

The value pair may be an IQ value.

The network node may further be caused to encode the transformed value pair when the transformed value pair is encodeable with less quantization noise compared to a received value pair, and otherwise encode and transmit the received value pair. The quantization noise may be determined based on the change of magnitude.

More than one value pair may be transformed with the same change of magnitude.

The network system may be a communication network system, and the network node 2 may be a BBU.

The network node may further be caused to receive the value pair from a core network node 3, and to transmit the transformed value pair to a radio unit 1.

FIG. 8 is a schematic diagram showing some components of the network node 2. The processing circuitry 30 may be provided using any combination of one or more of a suitable central processing unit, CPU, multiprocessing circuitry, microcontroller, digital signal processing circuitry, DSP, application specific integrated circuit etc., capable of executing software instructions of a computer program 34 stored in a memory. The memory can thus be considered to be or form part of the computer program product 32. The processing circuitry 30 may be configured to execute methods described herein with reference to FIG. 5.

The memory may be any combination of read and write memory, RAM, and read only memory, ROM. The memory may also comprise persistent storage, which, for example, can be any single one or combination of magnetic memory, optical memory, solid state memory or even remotely mounted memory.

A second computer program product 33 in the form of a data memory may also be provided, e.g. for reading and/or storing data during execution of software instructions in the processing circuitry 30. The data memory can be any combination of read and write memory, RAM, and read only memory, ROM, and may also comprise persistent storage, which, for example, can be any single one or combination of magnetic memory, optical memory, solid state memory or even remotely mounted memory. The data memory may e.g. hold other software instructions 35, to improve functionality for the network node 2.

The network node 2 may further comprise an input/output (I/O) interface 31 including e.g. a user interface. The network node 1 may further comprise a receiver configured to receive signalling from other nodes, and a transmitter configured to transmit signalling to other nodes (not illustrated). Other components of the network node 2 are omitted in order not to obscure the concepts presented herein.

Figure 10:
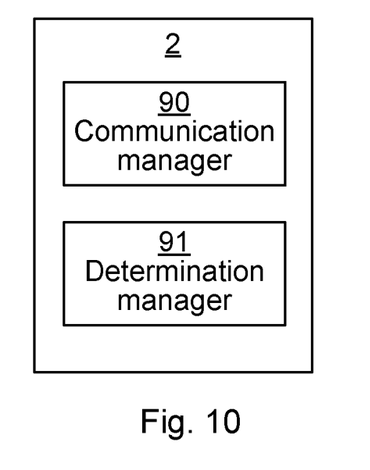

A network node 2 for data transmission of a value pair in a network system is presented with reference to FIG. 10. The network node 2 comprises a determination manager 91 for transforming S210 a value pair, wherein the value pair is represented as a complex number, by changing a magnitude of the value pair with a factor of 2 raised to the power of N/2, where N is an integer, and when N is odd the transform comprises a rotation in the complex plane of an odd integer multiple of 45 degrees, and a communication manager 90 for transmitting S230 the transformed value pair to another network node 1, wherein the transmission comprises an indication of the value of N.

FIG. 10 is a schematic diagram showing functional blocks of the network node 2. The modules may be implemented as only software instructions such as a computer program executing in the cache server or only hardware, such as application specific integrated circuits, field programmable gate arrays, discrete logical components, transceivers, etc. or as a combination thereof. In an alternative embodiment, some of the functional blocks may be implemented by software and other by hardware. The modules correspond to the steps in the method illustrated in FIG. 5, comprising a communication manager unit 90 and a determination manger unit 91. In the embodiments where one or more of the modules are implemented by a computer program, it shall be understood that these modules do not necessarily correspond to process modules, but can be written as instructions according to a programming language in which they would be implemented, since some programming languages do not typically contain process modules.

The communication manager 90 is for data transmission of a value pair in a network system. This module corresponds to the steps S200 and S230 of FIG. 5. This module can e.g. be implemented by the processing circuitry 30 of FIG. 8, when running the computer program.

The determination manger 91 is for data transmission of a value pair in a network system. This module corresponds to the steps S210, and S220 of FIG. 5. This module can e.g. be implemented by the processing circuitry 30 of FIG. 8, when running the computer program.

An embodiment of a computer program for data transmission of a value pair in a network system is presented with reference to FIG. 8. The computer program 34, 35 comprises computer program code which, when run in a network node 2, causes the network node to transform S210 a value pair, wherein the value pair is represented as a complex number, by changing a magnitude of the value pair with a factor of 2 raised to the power of N/2, where N is an integer, and when N is odd the transform comprises a rotation in the complex plane of an odd integer multiple of 45 degrees, and to transmit S230 the transformed value pair to another network node 1, wherein the transmission comprises an indication of the value of N.

A computer program product 32, 33 comprising a computer program 34, 35 and a computer readable storage means on which the computer program 34, 35 is stored, is also presented.

Figure 6:
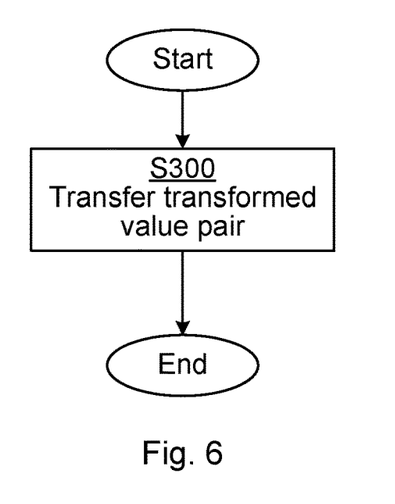

An embodiment of a method for enabling data transmission of a value pair in a network system is presented with reference to FIG. 6. The method is performed in a network system and comprises transferring S300 a transformed value pair, wherein the transformed value pair is represented as a complex number, with a changed magnitude of the value pair with a factor of 2 raised to the power of N/2, where N is an integer, and when N is odd the transform comprises a rotation in the complex plane of an odd integer multiple of 45 degrees, and wherein the transmission comprises an indication of the value of N.

An embodiment of an electromagnetic signal carrying computer-readable instructions for enabling data transmission of a value pair in a network system is presented. The electromagnetic signal transfers S300 a transformed value pair, wherein the transformed value pair is represented as a complex number, with a changed magnitude of the value pair with a factor of 2 raised to the power of N/2, where N is an integer, and when N is odd the transform comprises a rotation in the complex plane of an odd integer multiple of 45 degrees, and wherein the transmission comprises an indication of the value of N.

The aspects of the present disclosure have mainly been described above with reference to a few embodiments thereof. However, as is readily appreciated by a person skilled in the art, other embodiments than the ones disclosed above are equally possible within the scope of the invention, as defined by the appended patent claims.

The invention claimed is:

1. A method, performed in a network node, for data transmission of a value pair in a network system comprising:
   transforming a value pair, wherein the value pair is represented as a complex number, by changing a magnitude of the value pair with a factor of 2 raised to a power of N/2, where N is an integer, and when N is odd a transform comprises a rotation in the complex plane of an odd integer multiple of 45 degrees; and
   transmitting the transformed value pair to another network node, wherein the transmission comprises an indication of the value of N.

2. The method according to claim 1, wherein N is chosen as a largest value for which each of the values in the value pair can be represented in a predetermined data size.

3. The method according to claim 2, wherein the value pair is an In-Phase and Quadrature (IQ) value.

4. The method according to claim 3, further comprising:
   encoding the transformed value pair when the transformed value pair is encodeable with less quantization noise compared to a received value pair, and otherwise encoding and transmitting the received value pair.

5. The method according to claim 4, wherein the quantization noise is determined based on a change of magnitude.

6. The method according to claim 5, wherein more than one value pair is transformed with a same change of magnitude.

7. The method according to claim 6, further comprising:
   receiving the value pair from a core network node; and
   transmitting the transformed value pair to a radio unit.

8. A method, performed in a network node, for data transmission of a value pair in a network system comprising:
   receiving a value pair from another network node, wherein a transmission comprises an indication of a value of N; and
   transforming the received value pair, wherein the transformed value pair is represented as a complex number, by changing a magnitude of the received value pair with a factor of 2 raised to a power of −N/2, where N is an integer, and when N is odd a transform comprises a rotation in the complex plane of an odd integer multiple of 45 degrees.

9. The method according to claim 8, wherein the transformed value pair is an In-Phase and Quadrature (IQ) value.

10. The method according to claim 9, wherein more than one received value pair is transformed with a same change of magnitude.

11. The method according to claim 10, further comprising:
    decoding the transformed received value pair when indicated to be transformed, and otherwise decoding the received value pair.

12. The method according to claim 11, further comprising:
    receiving the value pair from a baseband unit; and
    transmitting the transformed value pair to a wireless communication unit.

13. A network node for data transmission of a value pair in a network system, the network node comprising:
    a processing circuitry; and
    memory storing instructions that, when executed by the processing circuitry, cause the network node to:
    transform a value pair, wherein the value pair is represented as a complex number, by changing a magnitude of the value pair with a factor of 2 raised to a power of N/2, where N is an integer, and when N is odd a transform comprises a rotation in the complex plane of an odd integer multiple of 45 degrees; and
    transmit the transformed value pair to another network node, wherein the transmission comprises an indication of a value of N.

14. The network node according to claim 13, wherein N is chosen as a largest value for which each of the values in the value pair can be represented in a predetermined data size.

15. The network node according to claim 14, wherein the value pair is an In-Phase and Quadrature (IQ) value.

16. The network node according to claim 15, wherein the network node further to:
    encode the transformed value pair when the transformed value pair is encodeable with less quantization noise compared to a received value pair, and otherwise encode and transmit the received value pair.

17. The network node according to claim 16, wherein the quantization noise is determined based on a change of magnitude.

18. The network node according to claim 13, wherein more than one value pair is transformed with a same change of magnitude.

19. The network node according to claim 13, wherein the network system is a communication network system, and the network node is a baseband unit (BBU).

20. The network node according to claim 19, wherein the network node further is caused to:
    receive the value pair from a core network node; and
    transmit the transformed value pair to a radio unit.

21. A network node for data transmission of a value pair in a network system, the network node comprising:
    a processing circuitry; and
    memory storing instructions that, when executed by the processing circuitry, cause the network node to:
    receive a value pair from another network node, wherein a transmission comprises an indication of a value of N; and
    transform the received value pair, wherein the transformed value pair is represented as a complex number, by changing a magnitude of the received value pair with a factor of 2 raised to a power of −N/2, where N is an integer, and when N is odd a transform comprises a rotation in the complex plane of an odd integer multiple of 45 degrees.

22. The network node according to claim 21, wherein the transformed value pair is an In-Phase and Quadrature (IQ) value.

23. The network node according to claim 22, wherein more than one received value pair is transformed with a same change of magnitude.

24. The network node according to claim 23, wherein the network node further is caused to:
    decode the transformed received value pair when indicated to be transformed, and otherwise decode the received value pair.

25. The network node according to claim 21, wherein the network system is a communication network system, and the network node is a radio unit.

26. The network node according to claim 25, wherein the network node further is caused to:
- receive the value pair from a baseband unit; and
- transmit the transformed value pair to a wireless communication unit.

* * * * *

UNITED STATES PATENT AND TRADEMARK OFFICE
CERTIFICATE OF CORRECTION

PATENT NO. : 11,637,574 B2
APPLICATION NO. : 17/312920
DATED : April 25, 2023
INVENTOR(S) : Fredrik Huss It is certified that error appears in the above-identified patent and that said Letters Patent is hereby corrected as shown below:

On the Title Page

On Page 2, in Item (56), under "OTHER PUBLICATIONS", in Column 1, Line 3, delete ""XRAN" and insert -- "xRAN --, therefor.

On Page 2, in Item (56), under "OTHER PUBLICATIONS", in Column 2, Line 9, delete "Reporton" and insert -- Report on --, therefor.

In the Specification

In Column 1, Line 22, delete "remote" and insert -- remotely --, therefor.

In Column 5, Line 39, delete "accurate." and insert -- accurately. --, therefor.

In Column 6, Line 21, delete "use" and insert -- used --, therefor.

In Column 6, Line 37, delete "to" and insert -- too --, therefor.

In Column 6, Line 38, delete "unnecessary" and insert -- unnecessarily --, therefor.

In Column 7, Line 16, delete "larges" and insert -- largest --, therefor.

In Column 8, Line 36, delete "Silo" and insert -- S110 --, therefor.

In Column 9, Line 43, delete "manger" and insert -- manager --, therefor.

In Column 9, Lines 60-61, delete "manger" and insert -- manager --, therefor.

In Column 10, Line 6, delete "manger" and insert -- manager --, therefor.

Signed and Sealed this
Twenty-fourth Day of October, 2023

Katherine Kelly Vidal
*Director of the United States Patent and Trademark Office*

In Column 12, Lines 14-15, delete "manger" and insert -- manager --, therefor.

In Column 12, Line 27, delete "manger" and insert -- manager --, therefor.